(12) United States Patent
Maloney et al.

(10) Patent No.: US 7,476,450 B2
(45) Date of Patent: Jan. 13, 2009

(54) COATING SUITABLE FOR USE AS A BONDCOAT IN A THERMAL BARRIER COATING SYSTEM

(75) Inventors: Michael J. Maloney, Marlborough, CT (US); David A. Litton, Rocky Hill, CT (US); Venkatarama K. Seetharaman, Rocky Hill, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 11/391,766

(22) Filed: Mar. 24, 2006

(65) Prior Publication Data

US 2008/0261073 A1    Oct. 23, 2008

(51) Int. Cl.
*B32B 15/01* (2006.01)
*B32B 15/04* (2006.01)
*B32B 15/20* (2006.01)
*C23C 4/06* (2006.01)
*C23C 4/08* (2006.01)
*C23C 4/12* (2006.01)
*C23C 16/06* (2006.01)
*C23C 16/50* (2006.01)
*F01D 5/14* (2006.01)

(52) U.S. Cl. .................. 428/680; 428/632; 428/633; 428/670; 428/332; 428/336; 427/456; 427/250; 416/241 R

(58) Field of Classification Search .......... 420/441, 420/442, 444, 445, 455, 456, 460; 416/241 R; 427/455, 456, 585, 250, 295, 404, 405, 540, 427/576, 419.2; 428/615, 680, 681, 678, 428/668, 632, 633, 670, 213, 214, 215, 336, 428/332; 148/426, 427, 428, 429
See application file for complete search history.

(56) References Cited

U.S. PATENT DOCUMENTS

| 4,719,080 | A |   | 1/1988 | Duhl et al. |
| 5,035,958 | A | * | 7/1991 | Jackson et al. ............... 428/553 |
| 5,043,138 | A | * | 8/1991 | Darolia et al. ............... 420/443 |
| 5,262,245 | A |   | 11/1993 | Ulion et al. |
| 6,007,645 | A |   | 12/1999 | Cetel et al. |
| 6,458,473 | B1 |   | 10/2002 | Conner et al. |
| 6,461,746 | B1 | * | 10/2002 | Darolia et al. ............... 428/632 |
| 6,485,845 | B1 |   | 11/2002 | Wustman et al. |
| 2003/0044634 | A1 | * | 3/2003 | Kelly et al. .................. 428/633 |

(Continued)

FOREIGN PATENT DOCUMENTS

EP    0 532 150 A1  *  3/1993

*Primary Examiner*—Michael La Villa
(74) *Attorney, Agent, or Firm*—Kinney & Lange, PA

(57) ABSTRACT

A coating suitable for use as a bondcoat for a thermal barrier coating system includes about 5 to about 10 weight percent of aluminum (Al), about 10 to about 18 weight percent of cobalt (Co), about 4 to about 8 weight percent of chromium (Cr), about 0 to about 1 weight percent of hafnium (Hf), about 0 to about 1 weight percent of silicon (Si), about 0 to about 1 percent of yttrium (Y), about 1.5 to about 2.5 weight percent of molybdenum (Mo), about 2 to about 4 weight percent of rhenium (Re), about 5 to about 10 weight percent of tantalum (Ta), about 5 to about 8 weight percent of tungsten (W), about 0 to about 1 weight percent of zirconium (Zr), and a remainder of nickel (Ni).

25 Claims, 1 Drawing Sheet

U.S. PATENT DOCUMENTS

2003/0211356 A1* 11/2003 Beers et al. ................. 428/680
2004/0042927 A1* 3/2004 O'Hara et al. .............. 420/444
2005/0118334 A1* 6/2005 Gorman et al. ............. 427/252
2006/0039820 A1* 2/2006 Darolia et al. .............. 420/444
2007/0138019 A1* 6/2007 Kasule ....................... 205/191

* cited by examiner

COATING SUITABLE FOR USE AS A BONDCOAT IN A THERMAL BARRIER COATING SYSTEM

STATEMENT OF GOVERNMENT INTEREST

The Government may have certain rights in this invention pursuant to Contract No. F33615-03-C-5231 awarded by the United States Air Force.

BACKGROUND

The present invention relates generally to a thermal barrier coating system for a component that is exposed to high temperatures, such as a gas turbine engine component (e.g., blades, vanes, etc.). More particularly, the present invention relates to a coating including a low aluminum content, where the coating is suitable for use as a bondcoat in a thermal barrier coating system.

A gas turbine engine component ("component"), such as a blade tip, blade trailing edge, blade platform, vane trailing edge, or vane platform, is typically exposed to a high temperature and high stress environment. The high temperature environment may be especially problematic with a superalloy component. Namely, the high temperatures may cause the superalloy to oxidize, which then decreases the life of the component. In order to extend the life of the component, a thermal barrier coating system (TBC system) may be applied to the entire superalloy component or selective surfaces, such as surfaces of the superalloy component that are exposed to the high temperatures and other harsh operating conditions. A TBC system reduces the temperature of the underlying material (also generally called the "substrate") and helps inhibit oxidation, corrosion, erosion, and other environmental damage to the substrate. Desirable properties of a TBC system include low thermal conductivity and strong adherence to the underlying substrate.

The TBC system typically includes a metallic bondcoat and a ceramic topcoat (i.e., a thermal barrier coating or TBC topcoat). The bondcoat is applied to the substrate and aids the growth of a thermally grown oxide (TGO) layer, which is typically aluminum oxide ($Al_2O_3$ or "alumina"). Specifically, prior to or during deposition of the TBC topcoat on the bondcoat, the exposed surface of the bondcoat can be oxidized to form the alumina TGO layer. The TGO forms a strong bond to both the topcoat and the bondcoat, and as a result, the TGO layer helps the TBC topcoat adhere to the bondcoat. The bond between the TGO and the topcoat is typically stronger than the bond that would form directly between the TBC topcoat and the bondcoat. The TGO also acts as an oxidation resistant layer, or an "oxidation barrier", to help protect the underlying substrate from damage due to oxidation.

During use in a gas turbine engine, the TGO thickens as aluminum diffuses into the TGO from the bondcoat and oxygen diffuses into the TGO from the combustion products and cooling air in the turbine gas path, reacting to form more alumina TGO. As the TGO thickness increases, it carries a proportionally larger share of any stresses that arise in the TBC system. Eventually, this share of the stress exceeds the strength of the TGO, leading to its failure. Once the TGO fails, the TBC topcoat spalls from the bondcoat because there is little to no TGO to provide adhesion.

Most bondcoats are designed to maintain slow growth of the TGO and to insure that the TGO consists of pure alumina. If the amount of aluminum that diffuses from the bondcoat to the TGO is insufficient to sustain growth of pure alumina, spinel oxide may form. Spinels grow quickly because they do not act as oxidation barriers. A TGO containing spinels has a significantly shorter life than a pure alumina TGO because spinels are not as strong as pure alumina.

The TBC topcoat may consist of a zirconia material that includes yttria as a stabilizing material. The primary role of the TBC topcoat is to provide insulation, thereby reducing the temperature of the bondcoat and the substrate. Thus, TBC ceramic topcoats are designed to have low thermal conductivity. There are various techniques of applying the TBC topcoat on the component, including air plasma spraying, vapor deposition and thermal spraying methods such as a high velocity oxy-fuel method.

The bondcoat is important to the life of the TBC system. If the bondcoat fails, the TBC topcoat may spall, after which the TBC system quickly deteriorates. TBC topcoat spallation exposes the bondcoat to the high-temperature, oxidizing environment of the turbine gas path, as well as to any corrosive species that may be in the gas path arising from impurities in the fuel and ingested fine particulates or contaminants. The higher temperatures and any deposits of contaminants accelerate the oxidation or corrosion of the bondcoat, eventually consuming the bondcoat. Once the bondcoat is consumed, the harsh environment attacks the underlying substrate. A deteriorated TBC system is undesirable because it may shorten the life of the component, and at the very least, requires the component to be taken out of service in order for the TBC system to be repaired. Whenever possible, the TBC system is removed and replaced prior to its complete failure to ensure no degradation of the underlying substrate.

In addition to its role in protecting the substrate from oxidation and corrosion, it is preferable that the bondcoat adheres well to the substrate with minimal reaction and inter-diffusion.

BRIEF SUMMARY

The present invention is a bondcoat suitable for use with a superalloy gas turbine engine component. In one embodiment, the bondcoat includes about 5 to about 10 weight percent of aluminum (Al), about 10 to about 18 weight percent of cobalt (Co), about 4 to about 8 weight percent of chromium (Cr), about 0 to about 1 weight percent of hafnium (Hf), about 0 to about 1 weight percent of silicon (Si), about 0 to about 1 percent of yttrium (Y), about 1.5 to about 2.5 weight percent of molybdenum (Mo), about 2 to about 4 weight percent of rhenium (Re), about 5 to about 10 weight percent of tantalum (Ta), about 5 to about 8 weight percent of tungsten (W), about 0 to about 1 weight percent of zirconium (Zr), and a remainder of nickel (Ni).

In another embodiment, the bondcoat includes about 5 to about 10 weight percent of Al, about 10 to about 18 weight percent of Co, about 4 to about 8 weight percent of Cr, about 0 to about 1 weight percent of Hf, about 0 to about 1 weight percent of Si, about 0 to about 1 percent of Y, about 1.5 to about 2.5 weight percent of Mo, about 2 to about 4 weight percent of Re, about 5 to about 10 weight percent of Ta, about 5 to about 8 weight percent of W, about 0 to about 1 weight percent of zirconium Zr, about 10 to about 40 weight percent of platinum (Pt) or other noble metals, such as palladium (Pd) or iridium (Ir), and a remainder of nickel (Ni).

DETAILED DESCRIPTION

Figure 1:
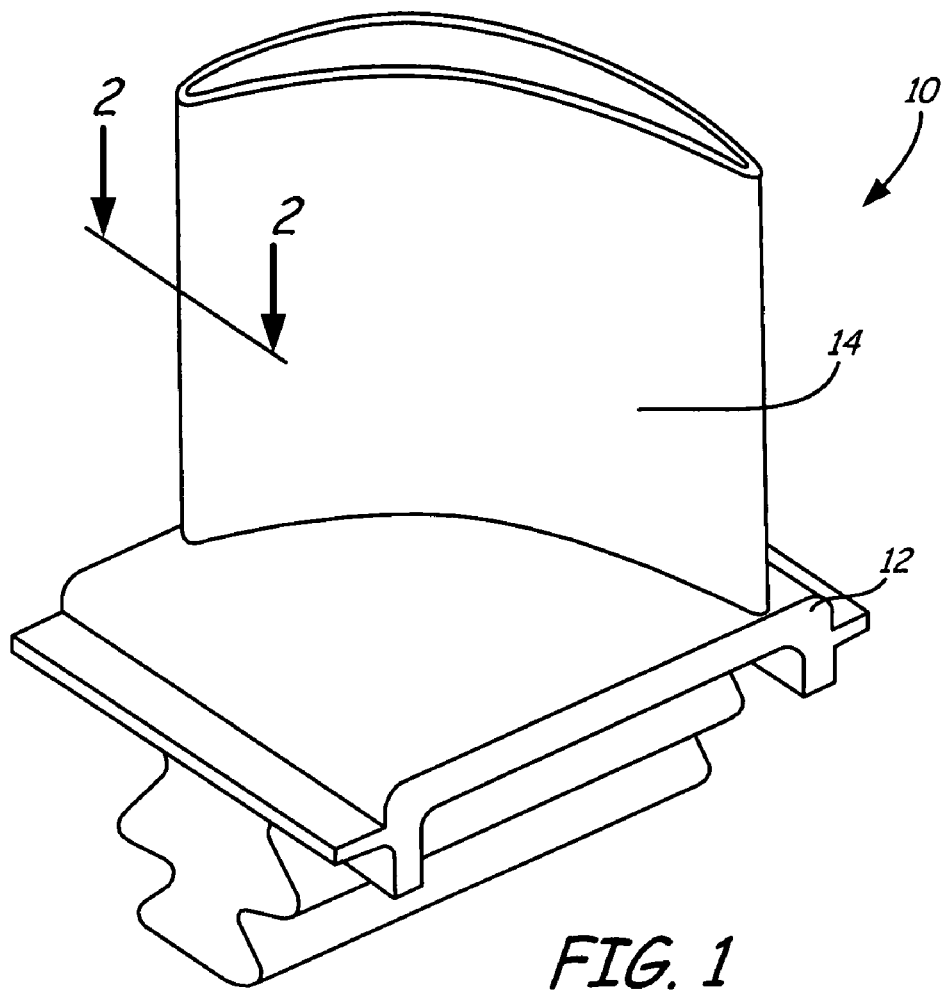
FIG. 1 is a perspective view of a turbine blade.

The present invention is a coating that is suitable for use as a bondcoat in a thermal barrier coating system. In one embodiment, the composition of the inventive coating includes about 5 to about 10 weight percent of Al, about 10 to about 18 weight percent of Co, about 4 to about 8 weight percent of Cr, about 0 to about 1 weight percent of Hf, about 0 to about 1 weight percent of Si, about 0 to about 1 percent of Y, about 1.5 to about 2.5 weight percent of Mo, about 2 to about 4 weight percent of Re, about 5 to about 10 weight percent of Ta, about 5 to about 8 weight percent of W, about 0 to about 1 weight percent of Zr, and a balance (or "remainder") of Ni. In another embodiment, about 10 to about 40 weight of Pt or other noble metals, such as Pd, Ir or combinations thereof, are substituted for some or all of the balance of Ni. The exact composition of the bondcoat may be modified within the broad ranges in order to form a bondcoat that exhibits desirable mechanical and chemical properties that are compatible with the underlying substrate.

The bondcoat of the present invention may be applied (or "deposited") to a suitable substrate, including a superalloy gas turbine engine component, in order to protect the substrate from oxidation, corrosion, erosion, and other adverse effects attributable to a harsh operating environment. The inventive bondcoat is particularly suitable for use with a component formed of a single crystal superalloy that is commonly designated a "fourth generation single crystal superalloy." The fourth generation single crystal superalloy contains high levels of ruthenium and rhenium, and exhibits enhanced creep strength compared to other single crystal alloys. An example of a fourth generation single crystal superalloy is described in U.S. Pat. No. 6,007,645, entitled, "Advanced High Strength, Highly Oxidation Resistant Single Crystal Superalloy Composition Having Low Cr Content."

One preferred composition of the bondcoat when used in conjunction with the fourth generation single crystal superalloy substrate described in U.S. Pat. No. 6,007,645 is: about 7.5 weight percent of Al, about 14 weight percent of Co, about 6 weight percent of Cr, about 0.5 weight percent of Hf, about 0.5 weight percent of Si, about 0.5 percent of Y, about 2.0 weight percent of Mo, about 3 weight percent of Re, about 7.5 weight percent of Ta, about 6.5 weight percent of W, about 0.5 weight percent of Zr, and about 51.5 weight percent of Ni. Another preferred composition is about 7.5 weight percent of Al, about 14 weight percent of Co, about 6 weight percent of Cr, about 0.5 weight percent of Hf, about 0.5 weight percent of Si, about 0.5 percent of Y, about 2.0 weight percent of Mo, about 3 weight percent of Re, about 7.5 weight percent of Ta, about 6.5 weight percent of W, about 0.5 weight percent of Zr, about 25 weight percent of Pt (or Pd or Ir), and about 26.5 weight percent of Ni.

The inventive bondcoat provides an oxidation resistant coating for a TBC system. After cycling a bondcoat having a composition in the ranges disclosed above in a burner rig at about 1148.89° C. (about 2100° F.), it was found that there was no evidence of bondcoat failure by oxidation or cracking after more than 100 cycles and more than 100 hours.

It has been found that when many existing TBC system bondcoats are applied to a single crystal superalloy substrate, such as the fourth generation single crystal superalloy substrate, aluminum diffuses from the bondcoat to the underlying substrate because the bondcoat typically has a higher aluminum content than the superalloy substrate. In addition, nickel and cobalt diffuse from the substrate into the bondcoat. It is desirable to minimize this interdiffusion in order to maximize the aluminum available for the stable and slow growth of a pure alumina TGO. Furthermore, when the single crystal superalloy substrate contains high concentrations of refractory metals such as rhenium (Re), the aluminum, nickel, and cobalt interdiffusion can result in the formation of deleterious topographically close packed (TCP) phases (i.e., phase instability) near the bondcoat-substrate interface. The phase instability adversely affects the mechanical properties of the superalloy, and essentially weakens the superalloy substrate. The deleterious phases act as sites for crack initiation because these phases typically form weak, high-angle grain boundaries with the superalloy substrate. If the degree of phase instability is extensive enough to consume a fair percentage of the substrate forming the component, the integrity of the component may be compromised.

The present invention is a bondcoat that includes a lower aluminum content than conventional bondcoats, while at the same time exhibits adequate oxidation resistance for a high-pressure turbine engine environment. The lower content of aluminum in the bondcoat contributes to a lower amount of diffusion of aluminum from the bondcoat to a superalloy substrate. As a result, the bondcoat of the present invention is more compatible with a fourth generation single crystal superalloy substrate, as well as other alloy substrates having high concentrations of refractory metals, than many existing bondcoats having a higher aluminum content. The possibility that the fourth generation single crystal superalloy substrate will form a TCP phase is decreased with a bondcoat of the present invention.

The aluminum content in a bondcoat aids the formation of an alumina TGO layer. As mentioned in the Background section, this TGO layer serves at least two purposes. First, the oxide layer acts as a barrier to oxidation of the underlying substrate (e.g., the fourth generation single crystal superalloy). Second, the TBC topcoat is inclined to chemically bond to the oxide layer. In a sense, the oxide layer acts as an adhesive to bond the TBC topcoat to the bondcoat. Despite a lower aluminum content than existing bondcoats, the bondcoat of the present invention contains a sufficient amount of aluminum to aid the growth of an oxide layer that is thick enough to act as an oxidation barrier. The aluminum in combination with the yttrium content of the inventive bondcoat aids the slow growth of a spinel-free oxide layer with good adhesion to both the TBC topcoat and to the bondcoat.

It has been found that the bondcoat of the present invention exhibits a coefficient of thermal expansion (CTE) of about 6.4 microns/inch/° F. This value is very similar to the CTE of a state-of-the-art superalloy, including a fourth generation superalloy. The propensity for thermal cycle induced cracking or failure of the bondcoat in a TBC system increases with an increase in the difference of CTE values between the bondcoat and the substrate on which it is applied. For this reason, it is preferable to minimize the difference in the CTE values, and even more preferable to have the same CTE value for the bondcoat and the substrate.

In addition to being used as a bondcoat in a thermal barrier coating system, a bondcoat of the present invention may also be a stand alone environmental coating, such as an oxidation and corrosion resistant coating.

FIG. 1 is a perspective view of turbine blade 10 of a gas turbine engine. Turbine blade 10 includes platform 12 and body 14. Body 14 of turbine blade 10 is formed of a fourth generation single crystal superalloy in accordance with the composition described in U.S. Pat. No. 6,007,645, where the specific composition exhibits a CTE of about 6.4 microns/inch/° F. Turbine blade 10 is exposed to high temperatures and high pressures during operation of the gas turbine engine. In order to extend the life of turbine blade 10 and protect turbine blade 10 from high stress operating conditions and the resulting oxidation and corrosion, TBC system 16 (shown in FIG. 2) is applied over body 14 of turbine blade 10.

The exact placement of TBC system 16 depends upon many factors, including the type of turbine blade 10 employed and the areas of turbine blade 10 that are exposed to the most stressful conditions. For example, in alternate embodiments, TBC system 16 may be applied over a part of the outer surface of body 14 rather than over the entire outer surface of body 14. Furthermore, because bondcoat 18 may also be a stand-alone environmental coating, body 14 may be fully covered with bondcoat 18 and only partly covered with ceramic layer 20. If turbine blade 10 includes cooling holes leading from internal cooling passages to the outer surface of body 14, TBC system 16 may also be applied to the surface of the cooling holes.

Turbine blade 10 is shown as an example of a gas turbine engine component that requires the use of a TBC system. However, the bondcoat of the present invention may be used with any suitable component for which it is desirable to protect against its operating environment, including other components in a gas turbine engine.

Figure 2:
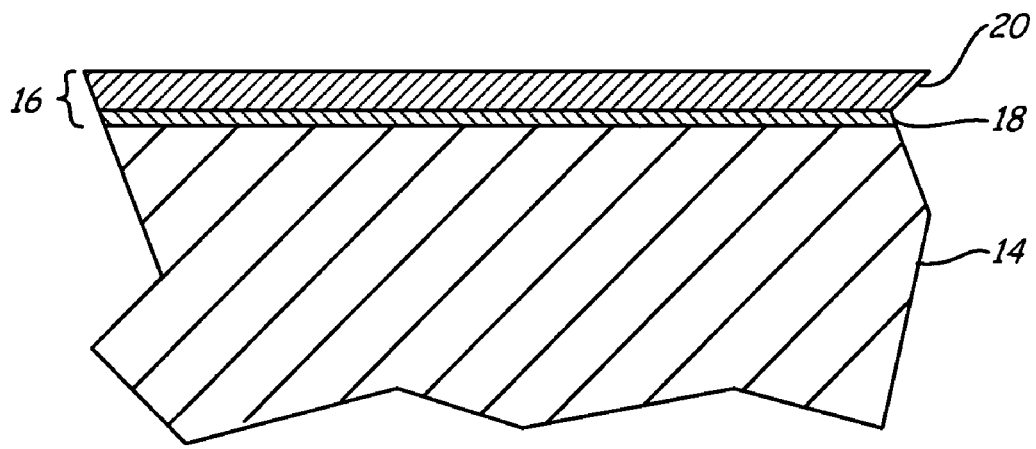
FIG. 2 is a cross-sectional view of the turbine blade of FIG. 1, where a section has been taken at line 2-2 (shown in FIG. 1), and shows a TBC system overlying the body of the turbine blade.

FIG. 2 is a sectional view of turbine blade 10, where a section is taken at line 2-2 in FIG. 1. TBC system 16 is applied to an exterior surface of body 14.

TBC system 16 includes bondcoat 18 and ceramic layer 20. Bondcoat 18 overlays and bonds to body 14, while ceramic layer 20 overlays bondcoat 18. In the embodiment shown in FIG. 2, bondcoat 18 is applied to body 14 in a thickness range of about 0.0127 millimeters (about 0.5 mils) to about 0.254 millimeters (about 10 mils). Ceramic layer 20 may be any thermal barrier coating (or "topcoat") that is suitable for use on alumina-forming bondcoats and/or alloys, such as, but not limited to, zirconia stabilized with yttria ($Y_2O_3$), gadolinia ($Gd_3O_3$), ceria ($CeO_2$), scandia ($Sc_2O_3$), or other oxides. Ceramic layer 20 is deposited in a thickness that is sufficient enough to provide the required thermal protection for bondcoat 18.

Bondcoat 18 consists essentially of about 5 to about 10 weight percent of Al, about 10 to about 18 weight percent of Co, about 4 to about 8 weight percent of Cr, about 0 to about 1 weight percent of Hf, about 0 to about 1 weight percent of Si, about 0 to about 1 percent of Y, about 1.5 to about 2.5 weight percent of Mo, about 2 to about 4 weight percent of Re, about 5 to about 10 weight percent of Ta, about 5 to about 8 weight percent of W, about 0 to about 1 weight percent of Zr, and a balance of Ni.

In another embodiment, bondcoat 18 consists essentially of about 5 to about 10 weight percent of Al, about 10 to about 18 weight percent of Co, about 4 to about 8 weight percent of Cr, about 0 to about 1 weight percent of Hf, about 0 to about 1 weight percent of Si, about 0 to about 1 percent of Y, about 1.5 to about 2.5 weight percent of Mo, about 2 to about 4 weight percent of Re, about 5 to about 10 weight percent of Ta, about 5 to about 8 weight percent of W, about 0 to about 1 weight percent of Zr, about 10 to about 40 weight percent of Pt, and a balance Ni. Alternatively, other noble metals such as Pd or Ir, or combinations thereof, can be substituted for Pt.

Bondcoat 18 includes a lower level of aluminum as compared to conventional bondcoats, and as a result, less aluminum diffuses from bondcoat 18 to body 14. This helps to minimize the formation of a TCP phase in body 14 that is attributable to the diffusion of aluminum from bondcoat 18 to body 14. As previously stated, body 14 is formed of superalloy that exhibits a CTE of about 6.4 microns/inch/° F. Bondcoat 18 also exhibits a CTE of about 6.4 microns/inch/° F.

Because the CTE values for bondcoat 18 and body 14 are similar, the propensity for thermal cycle induced cracking or failure of bondcoat 18 is decreased.

Bondcoat 18 in accordance with the present invention may be applied to body 14 (or another substrate in alternate embodiments) with any suitable technique, including thermal spray processes (e.g., plasma spray deposition or high velocity oxyfuel (HVOF) deposition), physical vapor deposition (e.g., cathodic arc deposition), or chemical vapor deposition. In one embodiment, a vacuum plasma spray deposition method is used to apply bondcoat 18 to body 14. As known in the art, vacuum plasma spray deposition is a thermal spray process that is carried out in a vacuum chamber. A plasma spray torch, which applies a powdered form of the coating onto a substrate, typically operates in a low-pressure environment of an inert gas, such as Argon. The plasma spray torch is typically manipulated by a control mechanism that allows the torch to move at least in one direction relative to the substrate.

In one method of applying bondcoat 18 to body 14, a vacuum plasma spray process is used, where the process utilizes a deposition chamber pressure ranging from about 13.33 kilopascals (kPa) (about 100 Torr) to about 40 kPa (about 300 Torr), a plasma torch current ranging from about 400 amperes (A) to about 900 A, and a plasma torch voltage ranging from about 50 volts (V) to about 85 V. The plasma spray torch is controlled by a 3 to 5 axis robot, which positions the torch about 15.24 centimeters (about 6 inches) to about 50.8 centimeters (about 20 inches) from body 14. During the deposition process, body 14 exhibits a temperature in a range of about 815.56° C. (about 1500° F.) to about 982.22° C. (about 1800° F.). In alternate embodiments, a vacuum plasma spray method including different parameters may be used.

In another embodiment, a cathodic arc deposition method, which is a type of physical vapor deposition, is used to apply bondcoat 18 to body 14. As known in the art, in a cathodic arc deposition method, a source material and a substrate to be coated are disposed in an evacuated deposition chamber. In the cathodic arc deposition embodiment, a deposition chamber pressure ranges from about 0.133 kPa (about 1 Torr) to about 13.33 kPa (about 100 Torr). Argon gas, flowing at a rate from about 100 standard cubic centimeters per minute (sccm) to about 500 sccm, maintains the chamber pressure in the desired range. Arc currents ranging from about 300 A to about 650 A are established and a negative bias from about 30 V to about 100 V is applied to body 14. In alternate embodiments, a cathodic arc deposition method including different parameters may be used.

The terminology used herein is for the purpose of description, not limitation. Although the present invention has been described with reference to a preferred embodiment, workers skilled in the art will recognize that changes may be made in form and detail without departing from the spirit and scope of the invention.

The invention claimed is:

1. A component comprising:
   a fourth generation single crystal superalloy substrate; and
   a bondcoat overlying at least a part of the superalloy substrate, the bondcoat comprising:
   about 5 to about 10 weight percent of aluminum;
   about 10 to about 18 weight percent of cobalt;
   about 4 to about 8 weight percent of chromium;
   0 to about 1 weight percent of hafnium;
   0 to about 1 weight percent of silicon;
   0 to about 1 weight percent of yttrium;
   about 1.5 to about 2.5 weight percent of molybdenum;
   about 2 to about 4 weight percent of rhenium;
   about 5 to about 10 weight percent of tantalum;

about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
a thermal barrier layer overlying at least part of the bondcoat.

2. The component of claim 1:
wherein the thermal barrier coating is selected from a group consisting of: zirconia stabilized with yttria, zirconia stabilized with gadolinia, zirconia stabilized with ceria, zirconia stabilized with scandia, and combinations thereof.

3. The component of claim 1, wherein the superalloy substrate is a turbine blade or vane.

4. The component of claim 1, wherein a thickness of the bondcoat is in a range of about 0.0127 minllimeters to about 0.254 millimeters.

5. The component of claim 1, wherein the bondcoat consists essentially of:
about 7.5 weight percent of aluminum;
about 14 weight percent of cobalt;
about 6 weight percent of chromium;
about 0.5 weight percent of hafnium;
about 0.5 weight percent of silicon;
about 0.5 weight percent of yttrium;
about 2.0 weight percent of molybdenum;
about 3.0 weight percent of rhenium;
about 7.5 weight percent of tantalum;
about 6.5 weight percent of tungsten;
about 0.5 weight percent of zirconium;
about 10 to about 25 weight percent of at least one of: platinum, palladium, iridium, or combinations thereof; and
about 26.5 to about 41.5 weight percent of nickel.

6. A method of forming a thermal barrier coating system on a superalloy substrate, the method comprising:
depositing a bondcoat on the superalloy substrate, the bondcoat comprising:
about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
depositing a thermal barrier coating over at least a part of the bondcoat, wherein the bondcoat is deposited using the thermal spray technique, the thermal spraying technique being a vacuum plasma spraying technique comprising:
a deposition chamber pressure in a range of about 13.33 kilopascals to about 40 kilopascals;
a plasma torch current in a range of about 400 amperes to about 900 amperes; and
a plasma torch voltage in a range of about 50 volts to about 85 volts.

7. The method of claim 6, wherein the thermal barrier coating is selected from a group consisting of: zirconia stabilized with yttria, zirconia stabilized with gadolinia, zirconia stabilized with ceria, zirconia stabilized with scandia, and combinations thereof.

8. The method of claim 6, wherein the bondcoat is deposited on the superalloy substrate in a thickness of about 0.0127 millimeters to about 0.254 millimeters.

9. The method of claim 6, wherein the bondcoat comprises:
about 51.5 weight percent of nickel.

10. The method of claim 6, wherein the bondcoat comprises:
about 10 to 25 weight percent of at least one of at least one of platinum, palladium, iridium, or combinations thereof; and
about 26.5 to about 41.5 weight percent of nickel.

11. A method of forming a thermal barrier coating system on a superalloy substrate, the method comprising:
depositing a bondcoat on the superalloy substrate, the bondcoat comprising:
about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
depositing a thermal barrier coating over at least a part of the bondcoat, wherein the bondcoat is deposited using a physical vapor deposition technique, the physical vapor deposition technique being a cathodic arc deposition technique comprising:
a deposition chamber pressure in a range of about 0.133 kilopascals to about 13.33 kilopascals;
an arc current in a range of about 300 amperes to about 650 amperes; and
a negative bias in a range of about 30 volts to about 100 volts applied to the superalloy substrate.

12. The method of claim 11, wherein the thermal barrier coating is selected from a group consisting of: zirconia stabilized with yttria, zirconia stabilized with gadolinia, zirconia stabilized with ceria, zirconia stabilized with scandia, and combinations thereof.

13. The method of claim 11, wherein the bondcoat is deposited on the superalloy substrate in a thickness of about 0.0127 millimeters to about 0.254 millimeters.

14. The method of claim 11, wherein the bondcoat comprises:
about 51.5 weight percent of nickel.

15. The method of claim 11, wherein the bondcoat comprises:
about 10 to 25 weight percent of at least one of at least one of platinum, palladium, iridium, or combinations thereof; and
about 26.5 to about 41.5 weight percent of nickel.

16. A component comprising:
a fourth generation single crystal superalloy substrate; and
a bondcoat overlying at least a part of the superalloy substrate, the bondcoat comprising:

about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
a thermal barrier layer overlying at least part of the bondcoat.

17. The component of claim 16:
wherein the thermal barrier coating is selected from a group consisting of: zirconia stabilized with yttria, zirconia stabilized with gadolinia, zirconia stabilized with ceria, zirconia stabilized with scandia, and combinations thereof.

18. The component of claim 16, wherein the superalloy substrate is a turbine blade or vane.

19. The component of claim 16, wherein a thickness of the bondcoat is in a range of about 0.0127 millimeters to about 0.254 millimeters.

20. A component comprising:
a fourth generation single crystal superalloy substrate; and
a protective coating overlying at least a part of the superalloy substrate, the protective coating comprising:
about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of at least one of: platinum, palladium, iridium, or combinations thereof; and
a remainder of nickel.

21. The component of claim 20, further comprising a thermal barrier coating overlying at least a part of the protective coating, wherein the thermal barrier coating is selected from a group consisting of: zirconia stabilized with yttria, zirconia stabilized with gadolinia, zirconia stabilized with ceria, zirconia stabilized with scandia, and combinations thereof.

22. The component of claim 20, wherein the superalloy substrate is a turbine blade or vane.

23. The component of claim 20, wherein a thickness of the protective coating is in a range of about 0.0127 millimeters to about 0.254 millimeters.

24. A method of forming a thermal barrier coating system on a superalloy substrate, the method comprising:
depositing a bondcoat on the superalloy substrate, the bondcoat comprising:
about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
depositing a thermal barrier coating over at least a part of the bond coat;
wherein the bondcoat is deposited using a thermal spraying technique, the thermal spraying technique being a vacuum plasma spraying technique comprising:
a deposition chamber pressure in a range of about 13.33 kilopascals to about 40 kilopascals;
a plasma torch current in a range of about 400 amperes to about 900 amperes; and
a plasma torch voltage in a range of about 50 volts to about 85 volts.

25. A method of forming a thermal barrier coating system on a superalloy substrate, the method comprising:
depositing a bondcoat on the superalloy substrate, the bondcoat comprising:
about 5 to about 10 weight percent of aluminum;
about 10 to about 18 weight percent of cobalt;
about 4 to about 8 weight percent of chromium;
0 to about 1 weight percent of hafnium;
0 to about 1 weight percent of silicon;
0 to about 1 weight percent of yttrium;
about 1.5 to about 2.5 weight percent of molybdenum;
about 2 to about 4 weight percent of rhenium;
about 5 to about 10 weight percent of tantalum;
about 5 to about 8 weight percent of tungsten;
0 to about 1 weight percent of zirconium;
about 10 to about 40 weight percent of a group consisting of platinum, palladium, iridium and combinations thereof; and
a remainder of nickel; and
depositing a thermal barrier coating over at least a part of the bond coat;
wherein the bondcoat is deposited using a physical vapor deposition technique, the physical vapor deposition technique being a cathodic arc deposition technique comprising:
a deposition chamber pressure in a range of about 0.133 kilopascals to about 13.33 kilopascals;
an arc current in a range of about 300 amperes to about 650 amperes; and
a negative bias in a range of about 30 volts to about 100 volts applied to the superalloy substrate.

* * * * *

UNITED STATES PATENT AND TRADEMARK OFFICE
CERTIFICATE OF CORRECTION

PATENT NO. : 7,476,450 B2  Page 1 of 1
APPLICATION NO. : 11/391766
DATED : January 13, 2009
INVENTOR(S) : Michael J. Maloney et al.

It is certified that error appears in the above-identified patent and that said Letters Patent is hereby corrected as shown below:

Column 7, Line 18, Claim 4 delete "minllimeters", insert --millimeters--

Signed and Sealed this

Eighth Day of June, 2010

David J. Kappos
*Director of the United States Patent and Trademark Office*